United States Patent [19]

Lundquist et al.

[11] Patent Number: 5,248,583
[45] Date of Patent: Sep. 28, 1993

[54] NEGATIVE SINGLE SHEET COLOR PROOFING SYSTEM BASED ON AQUEOUS DEVELOPABLE PHOTO-OLIGOMERS

[75] Inventors: Wallace R. Lundquist, Oakdale; Thomas P. Klun, Lakeland; Michael B. Heller, Inver Grove Heights; Leonard W. Sachi, Oakdale, all of Minn.

[73] Assignee: Minnesota Mining and Manufacturing Company, St. Paul, Minn.

[21] Appl. No.: 752,771

[22] Filed: Aug. 30, 1991

[51] Int. Cl.⁵ .................................. G03C 5/18
[52] U.S. Cl. ..................... 430/263; 430/143; 430/293; 430/358
[58] Field of Search ............... 430/262, 263, 293, 358, 430/143

[56] References Cited

U.S. PATENT DOCUMENTS

| | | | |
|---|---|---|---|
| 3,671,236 | 6/1972 | Van Beusekom | 430/293 |
| 4,260,673 | 4/1981 | Krech | 430/143 |
| 4,304,923 | 12/1982 | Rousseau | 560/26 |
| 4,529,683 | 7/1985 | Bishop | 430/262 |
| 4,596,757 | 6/1986 | Barton et al. | 430/257 |
| 4,666,817 | 5/1987 | Sachi | 430/160 |

FOREIGN PATENT DOCUMENTS

| | | |
|---|---|---|
| 0068599 | 1/1983 | European Pat. Off. |
| 0373438 | 6/1990 | European Pat. Off. |
| 2316626 | 1/1977 | France |

OTHER PUBLICATIONS

Paint and Surface Coatings: Theory and Practice, R. Lambourne, John Wiley and Sons, 1987 pp. 183-185.

Primary Examiner—Charles L. Bowers, Jr.
Assistant Examiner—Mark F. Huff
Attorney, Agent, or Firm—Gary L. Griswold; Walter N. Kirn; Mark A. Litman

[57] ABSTRACT

A photosensitive color proofing article comprising in the following order:
a) a carrier layer,
b) a release layer which acts as an oxygen barrier layer,
c) a photopolymerizable layer comprising a multifunctional acrylate oligomer and a colorant,
d) a photopolymerizable barrier layer, and
e) a thermal adhesive layer.

9 Claims, No Drawings

NEGATIVE SINGLE SHEET COLOR PROOFING SYSTEM BASED ON AQUEOUS DEVELOPABLE PHOTO-OLIGOMERS

FIELD OF THE INVENTION

This invention relates to a pre-sensitized colored film comprising of a support, an oxygen barrier which also serves as a release layer, a photosensitized color layer containing a multifunctional acrylate oligomer, a photopolymerizable barrier layer and a non-blocking thermoplastic adhesive layer. The colored films are used to form multi-color images on a single sheet for the purpose of proofing color separation negatives in preparation for multi-color lithographic reproduction.

BACKGROUND OF THE INVENTION

In color reproduction, it is often necessary to verify the color accuracy of separation negatives used in the printing process. The use of overlay and surprint proofing systems for this application is well known in the literature. Surprint proofing systems have by far received the most acceptance for applications where color assessment is critical. A surprint proof is generated by successively superimposing different colored layers upon each other on a single sheet. The surprint color proofing materials are composed of two primary types: photosensitive precolored sheets and photosensitive colorless sheets whose latent tacky or electrostatic image may be toned with pigments, inks or dyes. Some examples of post-colored proofing materials may be found in U.S. Pat. Nos. 3,060,024; 3,634,087; 3,649,268; 4,174,216; 4,294,909; 4,356,252; 4,600,669; 4,734,356; 4,869,996; DE 3,336,431 A1 and EP 319,098 patent applications. In these systems the image is colored with wet or dry pigment dispersions. In the application of dry powder toners, the dust can be a nuisance and could potentially be hazardous if inhaled, especially when it is applied manually. The liquid toners are typically dispersed in solvents such as Isopar TM which has a pungent odor and is considered combustible making the toner difficult to store and dispose of. Since the solvent must be evaporated to form a dry image, a solvent recovery unit may be necessary if regulated governmental agency limitations of permissible volatile organic components are exceeded. Attempts to eliminate these disadvantages are described in U.S. Pat. No. 4,806,451 and EP 365,361 A2 patent application, which describe the process of laminating a precolored sheet to the colorless image and then peeling it apart to produce the colored image. Other dry peel apart systems which incorporate the color layer with the photoactive layer include; U.S. Pat. Nos. 4,923,780; 4,987,051; 4,895,787; 4,910,120; 4,963,462; GB 2,213,950 A, EP 385,466 A2, EP 365,362 A2, and EP 313,191 A2 patent applications. To date, these systems do not provide the image quality which can be achieved by other methods, especially for negative systems.

Other examples of precolored proofing materials include constructions based upon both diazo oxides and photopolymers as the photosensitive element. In U.S. Pat. Nos. 4,482,625 and 4,304,836 two different precolored photopolymer constructions are described which are imaged prior to lamination to the substrate or intermediate sheet. A similar system is described in GB 2,144,867 A which utilizes precolored films sensitized with diazo based polymers. These systems require the imaged films to be laminated in register which is very dependent upon laminating speed, laminating temperature, and dimensional stability of the film and substrate. The accuracy of the registration is limited to smaller format proofs due to the difficulty in retaining perfect alignment of images during the thermal lamination process. This type of system also makes it very difficult to produce several small proofs on a single large sheet (scatter proofing).

U.S. Pat. No. 4,260,673 describes a positive acting presensitized color proofing sheet comprising a carrier sheet having a smooth release surface, diazo oxide sensitized color layer, a diazo oxide photoactive barrier layer and a thermal adhesive. The photoactive barrier layer is soluble in the developing media when exposed to light and provides a means of reducing interaction between the color layer and adhesive. U.S. Pat. Nos. 4,659,642; 4,772,533; and 4,948,693 describe improvements on this construction by eliminating the barrier layer. However, an aqueous highly alkali developer with pH ranges between 12 and 13 are still necessary for good development.

U.S. Pat. No. 3,671,236 describes a negative acting presensitized color proofing sheet comprising of a carrier sheet having a smooth release surface, a diazo sensitized color layer and a nonphotoactive barrier layer upon which may be coated a pressure sensitive adhesive or a thermal adhesive as described in U.S. Pat. No. 4,656,114. The developing media for this system is a 50:50 mixture of n-Propyl alcohol and water. The barrier layer is present as a carrier for the image and to reduce interaction between the adhesive and the photoactive layer. U.S. Pat. Nos. 4,650,738; 4,751,166; 4,808,508; 4,929,532; and 5,008,174; EP 365,356 A and EP 365,357 A2 patent applications describe improvements on this construction by eliminating the need for a barrier layer between the diazo based photoactive layer and the adhesive. The developer used in these systems are aqueous alkali solutions containing greater than 3% surfactant. U.S. Pat. No. 4,596,757 discloses a further improvement on the construction described in U.S. Pat. No. 3,671,236 utilizing a photo monomer system in place of the diazonium binders. Again an aqueous alkali developer is used which contains high concentrations of a surfactant (the example cited used 8.5%). The present invention improves upon the above mentioned constructions by utilizing a photoactive color layer containing a photo-oligomer as the photopolymerizable component and a photopolymerizable barrier layer to provide a proofing element which can be developed in a low solids aqueous developer having a pH of 10.2. This construction allows one to develop the image using a more environmentally compatible effluent since the aqueous developer contains less caustic and less ingredients than those used in the previously described systems.

SUMMARY OF THE INVENTION

The present invention provides a color proofing photosensitive element comprising, in order (a) a carrier support, (b) a release layer which also acts as an oxygen barrier, (c) a photosensitive color layer containing a photopolymerizable multifunctional acrylate oligomer, (d) a photopolymerizable barrier layer and (e) a thermal adhesive.

A multicolored image on a single substrate can be obtained by performing the following procedure using the aforesaid photosensitive element;

(i) laminating said element with heat and pressure via said thermal adhesive to a developer resistant receiver sheet;

(ii) removing said carrier sheet;

(iii) exposing said presensitized sheet through a color separation negative corresponding to the pigment of said color coating to actinic radiation to crosslink the exposed areas of the photosensitive element and rendering said color and barrier coatings insoluble in an aqueous alkaline developing medium to create a latent image;

(iv) developing said image with an aqueous alkaline developing medium whereby unexposed color and barrier coatings are removed and exposed color and barrier coatings remain;

(v) laminating an additional photosensitive element having a different color pigment in said color coating to the developed first presensitized sheet;

(vi) repeating steps (ii)-(iv) with a subsequent separation negative being in register with said developed first presensitized sheet; and (vii) repeating steps (v) and (ii)-(iv) in that order with additional presensitized elements as described above, each of said presensitized elements being of a different color, to provide a multicolored image on a single substrate.

It is recognized by one skilled in the art that other procedures can be used to obtain a multicolored image on a single substrate using the aforesaid photosensitive element in the processes described in U.S. Pat. Nos. 4,596,757; 4,650,738; 4,808,508; 4,929,532; 4,937,168; and EP 294,665 and EP 403,128 patent applications.

DETAILED DESCRIPTION OF THE INVENTION

The present invention provides a photosensitive colored element which comprises a carrier having a release surface, and when the photosensitive composition is sensitive to oxygen, the release surface is a coated layer which performs both as a releasing agent and oxygen barrier; a colored photosensitive layer containing a photo-oligomer on the release surface; a photopolymerizable barrier layer on the colored photosensitive layer; and a thermal adhesive layer on the barrier layer.

In the preferred embodiment, the carrier is composed of a dimensionally and chemically stable base material which is known in the art. One preferred material for use in the present invention is a 0.002 inch (0.051 mm) (2 mil) thick polyester film which may have a smooth or textured (matte) surface.

The carrier must have a release surface whose function is to serve as a parting layer between the carrier sheet and the photosensitive color layer. If the photosensitive color layer is sensitive to oxygen quenching during the exposure process, then an oxygen barrier layer is necessary. This oxygen barrier can function as both a barrier for oxygen and as a release layer. The oxygen barrier/release layer releases from the carrier and clings to the photosensitive color layer after lamination to a receiver and subsequent removal of the carrier. The release layer is coated onto the carrier using an aqueous solution of water soluble resins. Preferred water soluble resins non-exclusively include alkyl ethers of cellulose, polyvinyl alcohols and polyvinyl pyrrolidone. The release properties of the layer can be controlled by the incorporation of a water soluble surfactant. Preferred surfactants non-exclusively include alkylarylpolyether alcohols, glycerin and ethoxylated castor oil. In the preferred embodiment, the surfactant is present in the release layer in the amount of 0.1-5% by weight of solids in the layer, more preferably 0.5-2%. Other ingredients may be added such as mold inhibitors, anti-halation dyes, filter dyes, solvents, wetting agents, etc.

Adjacent to the release layer is coated the photosensitive color layer which typically comprises a photopolymerizable oligomer, colorant, initiator system, binders and other optional components such as wetting agents, surfactants, coating rheology modifiers, optical brighteners, plasticizers, residual solvents, etc. The photosensitive color layer is coated onto the releasable surface of the carrier using a mixture of solvents which give rise to the best coating quality and solution stability. Representative solvents include ketones, alkyl ethers or acetates of propylene glycol, alkyl ethers or acetates of ethylene glycol, dioxolane, butyrolactone, and alcohols.

The photopolymerizable oligomer comprises a multifunctional acrylate whose function is to form a high molecular weight polymer upon initiation by light generated radicals. The molecular weight of the acrylated oligomer influences several performance characteristics of the final coated film such as the tack of the coated film, the strength of the developer necessary to develop the image and the quality of the image attained. If the film imparts too much tack then it is difficult to manufacture the material in a production coating process without disruption of the film. This would give rise to poor coating quality. The strength of the developer required to develop the image is directly proportional to the molecular weight of the oligomer and the acid content of oligomer. Oligomers with lower molecular weights and high acid content are easier to develop and therefore do not need very aggressive developers. However, too much acid content or too high a molecular weight can cause destabilization of the pigment dispersions when acidic binders are used to disperse the pigments. When a low molecular weight oligomer such as Epoxy oligomer 1 (hereinafter described) is incorporated into the photosensitive color layer, the developability is increased so that a photosensitive barrier is not necessary; however, the tack of this film is very high, thus making the film impractical to coat on most production coaters. The film generated can be developed in a developer with low solids (3%) and low pH (8.1). Example 1 describes the use of Epoxy oligomer 2 (hereinafter described) which has a higher molecular weight and thus more acceptable tack; but requires a photosensitive barrier layer to achieve the optimum performance for developability and image quality with a developer comprising low solids (3%) and a pH of 10.2. Compositions of acrylated epoxy oligomers can be altered to achieve a balance between tack, developability and solution stability through the molecular weight of the material and the acid/amine content of the material. The preferred acrylated epoxy oligomer to achieve a coating which has acceptable tack has a mean molecular weight range of 2,400 to 5,000 and more preferably in the range of 2,400 to 3,500; and is present in the composition in the amount of 45-70% by weight (more preferably in the amount of 50-65%). Other acrylated oligomers which have shown utility include urethane oligomers as described in U.S. Pat. No. 4,304,923. An example of using urethane oligomer P-II is described in example 2 which can also be developed in a developer with low solids (2.1%) and a pH of 10.2. The preferred acrylated urethane oligomers to achieve a coating which has acceptable tack has a mean molecular weight range of 2,500 to 7,500 and more preferably in the range of 3,000 to 5,000; and is present in the composition in the amount of 45-70% by weight.

In the preferred embodiment, the photoinitiator(s) used must not generate a visible color change in the image or adhesive layers after exposure. Examples of photoinitiators non-exclusively include; triazines, acetophenones, benzophenones, and thioxanthones. The preferred photoinitiators include Irgacure TM 907(2-methyl-1-( 4-(methylthio)phenyl)-2-(4-morpholinyl)-1-propane) from Ciba Geigy, Irgacure TM 369 from Ciba Geigy, Quantacure TM ITX(isopropylthioxanthone) from Biddle Sawyer and triazines tethered to alkylarylpolyether alcohols (see U.S. patent application Ser. No., 07/752,775 filed this same day, 1991, titled "Light-Sensitive Article containing Non-Migrating Halomethyl-1,3,5-Triazines") and are present in the composition in the amount of 1.0-15% by weight. The optimum amount of initiator will be dependent upon the oligomer type used and the filtering effect of the pigment used.

Pigments or dyes may be used as colorants in the photosensitive color layer; however, pigments are preferred since they have a lower tendency for migration between the layers. The pigments are generally introduced into the photosensitive formulation in the form of a millbase comprising the pigment dispersed with a binder and suspended into a solvent or mixture of solvents. Many different pigments are available and are well known in the art. The pigment type and color are chosen such that the coated colored element is matched to a preset color target or specification set by the industry. Other colorants useful in the inventions include fluorescent and metallic materials as mentioned in "Paint and surface coatings: Theory and Practice" R. Lanbourne, Editor, Hasted Press, 1967 pages 183 to 185, These colorants can be used either alone or in combination with the above pigments to produce proofs when these effects are desired. The type of dispersing resin and the pigment to resin composition ratio choosen are dependent upon the pigment type, surface treatment on the pigment, dispersing solvent and milling process. Some examples of resins suitable for generating millbases which are compatible with the aforementioned photo-oligomers non-exclusively include; Polyvinyl acetate/crotonic acid copolymers, styrene maleic anhydride half esters resins, acrylic and methacrylic polymers and copolymers, polyvinyl acetals, polyvinyl acetals modified with anhydrides and amines, hydroxy alkyl cellulose resins and styrene acrylic resins. The primary composition of the dispersing resin is an acidic resin however, some non-acidic resins may be present. In some combinations a dispersing agent may be necessary to achieve optimum dispersion quality. Some examples of dispersing agents non-exclusively include; polyester/polyamine copolymers, Disperse Aids TM from Daniels, PKE 1370 polyester resin from Biddle Sawyer, alkylarylpolyether alcohols, and acrylic resins. Other components may also be included in the millbase such as surfactants to improve solution stability, fluorescent materials, optical brightners, UV absorbers, fillers, etc. The preferred composition of the millbase solids comprises 30-71% by weight pigment, 15-30% by weight acidic resin, 0-25% non-acidic resin, 0-20%, more preferably 0-10% dispersing agents. Additional binders may also be included in the photosensitive color formulation to balance developability and tack. Some examples of additional binders which are compatible with the aforementioned photo-oligomers and millbases non-exclusively include; Polyvinyl acetate/crotonic acid copolymers, styrene maleic anhydride half esters resins, acrylic and methacrylic polymers and copolymers, polyvinyl acetals, polyvinyl acetals modified with anhydrides and amines, and styrene acrylic resins. In the preferred composition of the photosensitive color layer, the pigment is present in the amount of 5-20% by weight, the acidic resin in the amount of 10-20% by weight and non-acidic resin in the amount of 0-5% by weight.

Coated adjacent to the photosensitive color layer is the photopolymerizable barrier layer. The photopolymerizable barrier layer is present to prevent interaction between the color layer and adhesive, and improves developability of the non-image areas. As previously discussed, this layer may be optional if the photosensitive color layer contains a photo-oligomer system which is low in molecular weight and has high developability. However, when photo-oligomer systems are used which reduce the tack of the color layer, the optimum performance of the element can be achieved if the photopolymerizable barrier is incorporated into the construction. The table in Example 3 compares two constructions: one with a photopolymerizable barrier and one without. The coating and drying processes, and formulations used for the oxygen barrier/release layer, photosensitive color layer and thermal adhesive layer were identical in both Examples 2 and 3. Each of the process colors developed to very clean backgrounds (less than 1ΔE measured spectophotometrically with a Gretag SPM spectrophotometer) in each of the elements generated using formulations described in Example 2. When the photopolymerizable barrier layer was removed (Example 3), each of the process colors show extremely high residual color in the non-image areas due to poor developability of the non-image areas. The composition of the photopolymerizable barrier layer comprises an ethylenically unsaturated compound which can form a higher molecular weight polymer upon photochemical radical initiation, an acidic binder and a photoinitiator. Preferred examples of ethylenically unsaturated compounds non-exclusively include acrylated epoxy oligomers acrylated urethane oligomers as described in U.S. Pat. No. 4,304,923, Echo Resin TM TAE 310(Triacrylated aromatic epoxide) and Dynacoll TM A 6083 (acrylated copolyester available from Huls) and are present in the composition in the amount of 50-65%. Preferred binders non-exclusively include; polyvinyl acetate/crotonic acid copolymers, styrene maleic anhydride half esters resins, acrylic and methacrylic polymers and copolymers, acidified polyvinyl acetals, and styrene acrylic resins and are present in the composition in the amount of 30-50%. Preferred photoinitiators non-exclusively include; Irgacure TM 907, Quantacure TM ITX (isopropylthioxthone) and triazines tethered to alkylarylpolyether alcohols and are present in the composition in the amount of 1-10% by weight. The thickness is generally between 0.15 and 2.0 g/m$^2$, preferably between 0.2 and 1.0 g/m$^2$ dry weight of the entire layer. This is about 0.15 to 2.0 micrometers in thickness.

Coated adjacent to the photopolymerizable barrier is the thermal adhesive layer. The thermal adhesive layer provides a means of laminating the element to a substrate under heat and pressure. The solvent used for this coating must not attack or interact with the adjacent layer. Examples of solvents include alcohols, water and hydrocarbon solvents. Because hydrocarbon solvents like heptane and naphtha are prone to irregular coating patterns, production is very difficult, more polar solvents such as water and alcohols are preferred. Some examples of thermal resins which may be used include; vinyl acetate polymers and copolymers, acrylic and methacrylic polymers, copolymers and terpolymers, polyvinylacetals and acrylamide copolymers and terpolymers. Vinyl acetate polymers have been found to be very sensitive to moisture and can cause blocking of the coated materials in shipment and storage if the vinyl acetate component of the adhesive is present at amounts greater than 20%. The preferred thermoplastics resins non-exclusively include; copolymers of vinyl acetate which contain less than 20% vinyl acetate, Wallpol TM 40165 available from Reichhold (terpolymer of vinyl acetate/methyl methacrylate/butyl acrylate), Synthemul TM 97-603 available from Reichhold (terpolymer of N-(hydroxymethyl) acrylamide/butyl acrylate/-methyl methacrylate), and copolymers of alkyl acrylates and alkyl methacrylates. Other additives may be present to aid in coating and performance such as surfactants, coalescence aids, plasticizers, polymethacrylate beads (as described in U.S. Pat. No. 4,885,225), silica, polyethylene waxes, optical brightners, UV absorbers, etc.

Developer solutions used to develop the image after exposure are typically comprised of a combination of Sodium or Potassium carbonate, and Sodium or Potassium bicarbonate and a surfactant. In the preferred embodiment the carbonate concentration is in an amount 0.5-2% by weight, the bicarbonate concentration is in the amount 0-1% by weight, and the surfactant concentration is in the amount 0.1-1% by weight of the total developer solution and the balance is water. The preferred surfactants non-exclusively include; Surfynol TM 465 (ethoxylated tetramethyl decynediol), Air Products; Surfactol TM 365 (ethoxylated castor oil),Cas-Chem; Triton X-100 (octylphenoxypolyethoxyethanol) and Surfynol TM GA (acetylenic diols compounded with other non-ionic surfactants and solvents), Air Products.

The invention will now be illustrated in the following non-limiting examples:

EXAMPLES

Example 1

The following oxygen barrier/release layer coating solution was coated and dried to achieve a dry coating weight of 0.8 g/m² onto 2 mil (0.05 mm) polyester film;

| OXYGEN BARRIER/RELEASE SOLUTION | |
|---|---|
| | (% by Weight) |
| Vinol ® 205 Polyvinyl alcohol | 5.6 |
| Vinol ® 107 Polyvinyl alcohol | 2.4 |
| Triton ® X-100 non-ionic surfactant | 0.2 |
| Kathon ® CG/ICP Preservative | 0.09 |
| D.I. Water | 91.7 |

Vinol ® 205 and Vinol ® 107 are available from Air Products
Triton ® X-100 is available from Rohm and Haas
Kathon ® CG/ICP is available from Rohm and Haas The following pigment millbases were prepared for incorporation into the photosensitive color coating solution;

| MILLBASE COMPOSITIONS (% by Weight) | | | | |
|---|---|---|---|---|
| | Green Shade Yellow | Red Shade Magenta | Green Shade Cyan | Black |
| Mobay Pigment YB-5785 | 12.0 | | | |
| Sun Magenta Pigment 234-0071 | | 12.0 | | |
| Sun Cyan Pigment 249-0592 | | | 12.0 | |
| Columbia Black Pigment Raven ® 760 | | | | 18.0 |
| Acidified Butvar ® B-98* | 8.0 | 8.0 | 8.0 | 12.0 |
| Methyl ethyl ketone | 56.0 | 56.0 | 56.0 | 50.0 |
| Propylene glycol mono methyl ether | 24.0 | 24.0 | 24.0 | 20.0 |

*Acidified Butvar ® B-98 = Butvar ® B-98 modified with succinic Anhydride and triethylamine (see U.S. Pat. Application S.N. 07/716,317, filed June 17, 1991).

The following photosensitive color coating solutions were coated and dried to a reflection optical density representative of the color specifications for each industry color target onto the previously coated oxygen barrier/release layer;

| PHOTOSENSITIVE COLOR SOLUTIONS (% by Weight) | | | | | |
|---|---|---|---|---|---|
| | % Solids | YELLOW | MAGENTA | CYAN | BLACK |
| Green Shade Yellow Millbase | 20 | 11.1 | | | |
| Red Shade Magenta Millbase | 20 | | 13.6 | | |
| Green Shade Cyan Millbase | 20 | | | 6.9 | |
| Black Milibase | 30 | | | | 10.7 |
| Acidified Butvar ® B-98 | | 1.64 | 2.1 | 1.8 | 2.4 |
| Epoxy Oligomer #2 | | 5.28 | 6.5 | 4.7 | 7.5 |
| Irgacure ® 907 | | 0.84 | 0.7 | 0.9 | 1.2 |
| Quantacure ® ITX | | 0.51 | 0.4 | 0.5 | 0.7 |
| MEK | | 80.6 | 76.7 | 85.2 | 77.5 |

Epoxy Oligomer #2 = Oligomer of pentaerythritol triacrylate & succinic anhydride/EPON TM 1001(diglycidyl ether of bisphenol A)/0.45 succinic anhydride and triethylamine/1.5 diethanolamine
Acidified Butvar ® B-98 = Butvar ® B-98 modified with succinic anhydride and triethyl amine (as described in U.S. Pat. Application S.N. 07/716,317)
Irgacure ® 907 (2-Methyl-1-(4-(methylthio)phenyl-2-(4-morpholinyl)-1-propane) available from Ciba-Geigy
Quantacure ® ITX (Isopropyl thioxanthone) available from Biddle Sawyer The following photopolymerizable barrier coating solution was coated and dried to a dry coating weight of 0.65 g/m² onto the previously coated photosensitive color layer;

| PHOTOSENSITIVE BARRIER SOLUTION | |
|---|---|
| | (% by Weight) |
| Epoxy Oligomer #2 | 6.2 |
| Acidified Butvar ® B-98 | 2.4 |
| Irgacure ® 907 | 1.2 |
| Quantacure ® ITX | 0.2 |

-continued

PHOTOSENSITIVE BARRIER SOLUTION

| | (% by Weight) |
|---|---|
| MEK | 90.0 |

Epoxy Oligomer #2 = Oligomer of pentaerythritol triacrylate & succinic anhydride/EPON ® 1001 (diglycidyl ether of bisphenol A)/0.45 succinic anhydride and triethylamine/1.5 diethanolamine epoxy.
Acidified Butvar ™ B-98 = Butvar ™ B-98 modifed with succinic anhydride and triethyl amine (as described in U.S.S.N 7/716,317 above.)
Irgacure ™ 907 (2-Methyl-1-(4-(methylthio)phenyl-2-(4-morpholinyl)-1-propane) available from Ciba-Geigy
Quantacure ® ITX (Isopropyl thioxanthone) available from Biddle Sawyer The following thermal adhesive coating solution was coated and dried to achieve a dry coating weight of 4.3 g/m² onto the previously coated photopolymerizable barrier layer;

THERMAL ADHESIVE SOLUTION

| | (% Solids) | (% by Weight) |
|---|---|---|
| Reichold Wallpol ® 40-100* | 45.5 | 77.6 |
| D.I. Water | | 22.2 |
| MA-8 PMMA Beads | 30.0 | 0.2 |

*Wallpol ® 40-100 (vinyl acetate latex adhesive) available from Reichhold. The PMMA bead composition is described in U.S. Pat. #4,885,225

The multicolored proof using the four process color films was imaged and developed as described in the summary. The following developer composition was used to develop the image;

DEVELOPER SOLUTION

| | (% by Weight) |
|---|---|
| Potassium Carbonate | 1.0 |
| Potassium Bicarbonate | 1.0 |
| Surynol ® GA* | 1.0 |
| Water | 97.0 |

*Surfynol ® GA (acetylenic diols compounded with other non-ionic surfactant and solvents) available from Air Products

Example 2

The following oxygen barrier/release layer coating solution was coated and dried to achieve a dry coating weight of 0.8 g/m² onto 2 mil (0.05 mm) polyester film;

OXYGEN BARRIER/RELEASE SOLUTION

| | (% by Weight) |
|---|---|
| Vinol ® 205 Polyvinyl alcohol | 5.6 |
| Vinol ® 107 Polyvinyl alcohol | 2.4 |
| Triton ® X-100 non-ionic surfactant | 0.2 |
| Kathon ® CG-ICP | 0.09 |
| D.I. Water | 91.7 |

Vinol ™ 205 and Vinol ™ 107 are available from Air Products
Triton ™ X-100 is available from Rohm and Haas
Kathon ™ CG/ICP is available from Rohm and Haas The following pigment millbases were prepared for incorporation into the photosensitive color coating solution;

MILLBASE COMPOSITIONS (% by Weight)

| | Green Shade Yellow | Red Shade Yellow | Red Shade Magenta | Blue Shade Magenta |
|---|---|---|---|---|
| Mobay Pigment YB-5785 | 11.6 | | | |
| Sun Yellow Pigment 275-0005 | | 11.6 | | |
| Sun Magenta Pigment 234-0071 | | | 11.2 | |
| Mobay Magenta Pigment RV-6803 | | | | 6.8 |
| Butvar ® B-98 | 2.7 | 2.7 | 1.5 | 2.3 |
| Joncryl ® 67 | 5.0 | 2.7 | 6.0 | 2.3 |
| Disperbyk ® 161 | 0.6 | 0.6 | 1.1 | 0.7 |
| FC-430 | 0.04 | 0.04 | 0.2 | 0.02 |
| Methyl ethyl ketone | 56.0 | 56.0 | 56.0 | 61.4 |
| Propylene glycol monomethyl ether | 24.0 | 24.0 | 24.0 | 26.6 |

| | Green Shade Cyan | Red Shade Cyan | Black |
|---|---|---|---|
| Sun Cyan Pigment 249-0592 | 11.6 | | |
| Sun Cyan Pigment 248-0615 | | 11.6 | |
| Columbia Black Pigment Raven ® 760 | | | 16.6 |
| Butvar ® B-98 | 3.9 | 4.0 | 3.0 |
| Joncryl ® 67 | 3.9 | 4.0 | 8.9 |
| Disperbyk ® 161 | 0.6 | 0.6 | 1.5 |
| FC-430 | 0.04 | 0.04 | 0.05 |
| Methyl ethyl ketone | 56.0 | 56.0 | 50.0 |
| Propylene glycol monomethyl ether | 24.0 | 24.0 | 20.0 |

Butvar ® B-98 (Polyvinyl butyral) available from Monsanto
Joncryl ® (Styrene acrylic resin) available from Johnson Wax
Disperbyk ® 161 available from Byk Chemie
FC-430 (fluorinated nonioniuc surfactant CAS# 11114-17-3) available from 3M The following photosensitive color coating solutions were coated and dried to a reflection optical density representative of the color specifications for each industry color target on the previously coated oxygen barrier/release layer;

PHOTOSENSITIVE COLOR SOLUTIONS (% by Weight)

| | % Solids | YELLOW | MAGENTA | CYAN | BLACK |
|---|---|---|---|---|---|
| Green Shade Yellow Millbase | 20 | 16.1 | | | |

-continued

PHOTOSENSITIVE COLOR SOLUTIONS
(% by Weight)

|  | % Solids | YELLOW | MAGENTA | CYAN | BLACK |
|---|---|---|---|---|---|
| Red Shade Yellow Millbase | 20 | 3.5 | | | |
| Red Shade Magenta Millbase | 20 | | 17.0 | | |
| Blue Shade Magenta Millbase | 12 | | 7.5 | | 2.0 |
| Green Shade Cyan Millbase | 20 | | | 13.6 | |
| Red Shade Cyan Millbase | 20 | | | 4.0 | 2.6 |
| Black Millbase | 30 | 0.08 | 0.4 | 0.2 | 18.1 |
| Acrylated Urethane Oligomer P-II* | 64 | 11.5 | 16.7 | 25.8 | 15.3 |
| Acidified Butvar ® B-98 | 21 | 5.7 | 3.6 | 3.8 | 7.2 |
| Triazine Initiator | 50.6 | 2.9 | 1.3 | 1.6 | 4.1 |
| Joncryl ® 67 | | | 4.0 | 5.0 | 0.9 |
| Methyl ethyl ketone | | 43.2 | 34.8 | 46.0 | 38.9 |
| Propylene glycol mono methyl ether | | 17.0 | 14.7 | | 10.9 |

*Synthesis described in U.S. Pat. No. 4,304,923
Triazine Initiator = m-MOST-ol tethered to Igepal CO-520 (as described in U.S. Pat. Application attorneys docket number 47574USA4A noted above)
Acidified Butvar ® B-98 = Butvar ® B-98 modified with succinic anhydride and triethyl amine (as described in U.S. Pat. Application No. 07/716,317)
Joncryl ® 67 (available from Johnson Wax) = Styrene acrylic resin The following photopolymerizable barrier coating solution was coated and dried to a dry coating weight of 0.38 g/m² onto the previously coated photosensitive color layer;

PHOTOSENSITIVE BARRIER SOLUTION

|  | (% Solids) | (% by Weight) |
|---|---|---|
| Dynacol ® A6083 | 50.0 | 5.7 |
| Joncryl ® 586 | 50.0 | 3.8 |
| Triazine Initiator | 50.6 | 0.5 |
| MEK | | 90.0 |

Dynacol ® A6083 (acrylated copolyester) available from Huls Joncryl ® 586 (Syrene acrylic resin) available from Johnson Wax
Triazine Initiator = m-MOST-ol tethered to Igepal CO-520 (see U.S. Pat. Application S.N. 07/752,775 bearing Attorney's Docket No. 47574USA4A filed this day and titled "Light-Sensitive Article Containing Non-Migrating Haloethyl-1,3,5-Triazines")

The following thermal adhesive coating solution was coated and dried to achieve a dry coating weight of 6.5 g/m² onto the previously coated photopolymerizable barrier layer;

THERMAL ADHESIVE SOLUTION

|  | (% Solids) | (% by Weight) |
|---|---|---|
| Reichold Synthemul ® R-97603 | 45.5 | 77.6 |
| D.I. Water | | 22.2 |
| MA-8 PMMA Beads | 30.0 | 0.2 |

Synthemul ™ R-97603 (terpolymer of N-(hydroxymethyl) acrylamide/butyl acrylate/methyl methacrylate) available from Reichhold. The PMMA bead composition is described in U.S. Pat. #4,885,225

The multicolored proof using the four process color films was imaged and developed as described in the summary. The following developer composition was used to develop the image;

DEVELOPER SOLUTION

|  | (% by Weight) |
|---|---|
| Potassium Carbonate | 1.0 |
| Potassium Bicarbonate | 1.0 |
| Surynol ® 465 | 0.1 |
| Water | 97.9 |

Surfynol ® 465 (Ethoxylated tetramethyldecynediol) available from Air Products

Example 3

Same as example 2 except no photopolymerizable barrier layer was coated in the constructions for the four process colors.

|  | Example 2 | | | | Example 3 | | | |
|---|---|---|---|---|---|---|---|---|
|  | Yellow | Magenta | Cyan | Black | Yellow | Magenta | Cyan | Black |
| ΔL* | 0.27 | 0.13 | 0.27 | 0.34 | −1.27 | 1.34 | −3.32 | −12.33 |
| Δa* | −2.40 | −0.05 | −0.07 | −0.09 | −6.37 | 3.41 | −6.08 | 0.11 |
| Δb* | 0.12 | −0.08 | 0.01 | −0.08 | 27.95 | −0.91 | −5.37 | 0.62 |
| ΔE | 0.38 | 0.16 | 0.29 | 0.36 | 28.69 | 3.77 | 8.77 | 12.35 |

PREPARATIONS

The following preparatory examples illustrate methods for synthesizing photopolymerization initiators (photoinitiators) that are useful in this invention. All percentages are percentages by weight, unless indicated otherwise.

Preparation I

This preparation illustrates the synthesis of 2,4-bis(trichloromethyl)-6-[3-(2-hydroxyethoxy)styryl]-1,3,5-triazine, referred to hereinafter as meta-MOSTOL.

A stirred solution of 2,4-bis(trichloromethyl)-6-methyl-1,3,5-triazine (103 g, 0.31 mole), 3-(2-hydroxyethoxy)benzaldehyde (47 g, 0.28 mole), and ammonium acetate (10.5 g) in 270 mL of methanol was refluxed for 12 hours. After the mixture had cooled, an additional 80 mL of methanol was added, followed by 112 mL of water. The product precipitated from the reaction solution, was filtered and dried to yield 74 g of meta-MOSTOL, mp 127°–128° C.

Preparation II

This preparation illustrates a simple, two-step, one-batch reaction of 2,4-bis(trichloromethyl)-6-[3-(2-hydroxyethoxy) styryl]-1,3,5-triazine (meta-MOSTOL), 2,4-tolylene diisocyanate (TDI), and polyoxyethylene nonylphenol ("IGEPAL CO-520") to prepare a mixture containing 80% meta-MOSTOL/TDI/POENP5, 15% [meta-MOSTOL]$_2$/TDI, and 5% [POENP5]$_2$/TDI, which mixture can function as a photoinitiator. (POENP5 is a commercially available polyoxyethylene nonylphenol having a mole ratio of 5 polyoxyethylene units to nonylphenyl units.)

To a stirred dispersion containing 2,4-bis(trichloromethyl)-6-[3-(2-hydroxyethoxy)styryl]-1,3,5-triazine (55.00 g, 0.1151 mole) and 2,4-tolylene diisocyanate (18.2 g, 0.102 mole) in 200 mL of toluene at a temperature of 16° C. was added dibutyltin dilaurate (0.150 g). A slight exotherm raised the temperature of the reaction mixture to 19° C. and the reaction mixture became clear after approximately 20 minutes. The meta-MOSTOL had completely reacted in 5 hours and the resulting mixture was analyzed by GPC and found to contain the following materials: meta-MOSTOL/TDI (54.5 g, 0.0837 mole), (meta-MOSTOL)$_2$/TDI (17.7 g, 0.0314 mole), and 2,4-tolylene diisocyanate (0.9 g, 0.0052 mole).

To this mixture was added a 79.2% solution of polyoxyethylene nonylphenol ("IGEPAL CO-520") (58.92 g, 0.0941 mole) in toluene and the solution was heated to a temperature of 60° C. and maintained at that temperature for 4 hours. Infrared analysis indicated that all of the isocyanate had reacted. The reaction mixture was determined by high performance liquid chromatography (HPLC) analysis to contain approximately 80% (96.0 g) meta-MOSTOL/TDI/POENP5, 15% (17.8 g) [meta-MOSTOL]$_2$/TDI, and 5% (6.0 g)[POENP5]$_2$/TDI. Removal of the toluene under vacuum by means of a rotary evaporator provided a slightly brown viscous syrup. For ease of handling, this material was redissolved in sufficient methyl ethyl ketone to produce a solution having a concentration of approximately 50%.

I claim:

1. A photosensitive color proofing article comprising in the following order:
   a) a carrier layer,
   b) a release layer which acts as an oxygen barrier layer,
   c) a photopolymerizable layer comprising a multifunctional acrylate oligomer and a colorant,
   d) a photopolymerizable barrier layer adjacent to layer c), and
   e) a thermal adhesive layer.

2. The article of claim 1 wherein said release layer is water dispersible.

3. The article of claim 1 wherein said release layer is water soluble.

4. The article of claim 1 wherein said release layer comprises a polymer selected from the group consisting of alkylethers of cellulose, polyvinyl alcohol, and polyvinyl pyrrolidone.

5. The article of claim 1 wherein said release layer comprises from 0.1 to 5% by weight of solids of a surfactant.

6. The article of claim 2 wherein said release layer comprises from 0.1 to 5% by weight of solids of a surfactant.

7. The article of claim 3 wherein said release layer comprises from 0.1 to 5% by weight of solids of a surfactant.

8. The article of claim 4 wherein said release layer comprises from 0.1 to 5% by weight of solids of a surfactant.

9. A colored photographic element comprising a substrate having sequentially disposed thereon an optional oxygen barrier/release layer, a low tack colored, photopolymerizable, photosensitive layer; a photopolymerizable barrier layer; and a thermal adhesive layer, said element being developable in an aqueous developer with a pH less than 10.5, and 3% or less solids.

* * * * *

UNITED STATES PATENT AND TRADEMARK OFFICE
CERTIFICATE OF CORRECTION

PATENT NO. : 5,248,583
DATED : September 28, 1993
INVENTOR(S) : Lundquist et al.

It is certified that error appears in the above-indentified patent and that said Letters Patent is hereby corrected as shown below:

Column 4, line 40, delete "oligomer 1" and insert --oligomer #1--.

Column 4, line 47, delete "oligomer 2" and insert --oligomer #2--.

Column 9, line 8, delete "7/716,317" and insert --07/716,317--.

Signed and Sealed this

Twentieth Day of September, 1994

Attest:

BRUCE LEHMAN

Attesting Officer          Commissioner of Patents and Trademarks